US010243036B2

United States Patent
Tsai et al.

(10) Patent No.: US 10,243,036 B2
(45) Date of Patent: Mar. 26, 2019

(54) SEMICONDUCTOR STRUCTURE AND MANUFACTURING METHOD THEREOF AND TERMINAL AREA STRUCTURE OF SEMICONDUCTOR DEVICE

(71) Applicant: UBIQ Semiconductor Corp., Hsinchu County (TW)

(72) Inventors: Yi-Yun Tsai, Hsinchu County (TW); Chih-Hung Chen, Hsinchu County (TW); Chin-Fu Chen, Hsinchu County (TW)

(73) Assignee: UBIQ Semiconductor Corp., Hsinchu County (TW)

( * ) Notice: Subject to any disclaimer, the term of this patent is extended or adjusted under 35 U.S.C. 154(b) by 0 days.

(21) Appl. No.: 15/869,086

(22) Filed: Jan. 12, 2018

(65) Prior Publication Data

US 2018/0337229 A1 Nov. 22, 2018

(30) Foreign Application Priority Data

May 19, 2017 (TW) .............................. 106116564 A

(51) Int. Cl.
| | |
|---|---|
| *H01L 29/66* | (2006.01) |
| *H01L 29/40* | (2006.01) |
| *H01L 29/423* | (2006.01) |
| *H01L 29/76* | (2006.01) |
| *H01L 29/94* | (2006.01) |
| *H01L 29/06* | (2006.01) |
| *H01L 29/78* | (2006.01) |

(52) U.S. Cl.
CPC ...... *H01L 29/0611* (2013.01); *H01L 29/4236* (2013.01); *H01L 29/66734* (2013.01); *H01L 29/7813* (2013.01)

(58) Field of Classification Search
CPC ........... H01L 29/7813; H01L 29/66719; H01L 29/66734; H01L 29/7806; H01L 29/42368; H01L 29/456; H01L 29/47; H01L 29/4925; H01L 29/4933
See application file for complete search history.

(56) References Cited

U.S. PATENT DOCUMENTS

| | | | |
|---|---|---|---|
| 6,838,722 B2 | 1/2005 | Bhalla et al. | |
| 7,449,354 B2 | 11/2008 | Marchant et al. | |
| 9,252,239 B2 | 2/2016 | Yilmaz et al. | |
| 2003/0178673 A1* | 9/2003 | Bhalla ............. | H01L 21/823487 257/330 |

(Continued)

*Primary Examiner* — Brian Turner
(74) *Attorney, Agent, or Firm* — JCIPRNET

(57) ABSTRACT

A semiconductor structure including a substrate, a first dielectric layer, a first conductive layer, a positioning part, two spacers, and a second conductive layer is provided. The substrate has a first trench. The first dielectric layer is disposed on a surface of the first trench. The first conductive layer is filled in the first trench and located on the first dielectric layer. The positioning part is disposed on the substrate and has a first opening. The first opening exposes the first trench. The spacers are disposed on two sidewalls of the first opening and expose the first conductive layer. The second conductive layer is filled in the first opening and electrically connected to the first conductive layer. The semiconductor structure can prevent the generation of leakage current while maintaining a high breakdown voltage.

16 Claims, 11 Drawing Sheets

(56) References Cited

U.S. PATENT DOCUMENTS

2007/0075362 A1\* 4/2007 Wu ..................... H01L 29/7813
257/335
2011/0039383 A1\* 2/2011 Chen ................... H01L 29/7813
438/270

\* cited by examiner

SEMICONDUCTOR STRUCTURE AND MANUFACTURING METHOD THEREOF AND TERMINAL AREA STRUCTURE OF SEMICONDUCTOR DEVICE

CROSS-REFERENCE TO RELATED APPLICATION

This application claims the priority benefit of Taiwan application serial no. 106116564, filed on May 19, 2017. The entirety of the above-mentioned patent application is hereby incorporated by reference herein and made a part of this specification.

BACKGROUND OF THE INVENTION

Field of the Invention

The invention relates to a semiconductor structure and a manufacturing method thereof, and more particularly, to a semiconductor structure that can increase breakdown voltage and a manufacturing method thereof and a terminal area structure of a semiconductor device.

Description of Related Art

In the interconnect process of a semiconductor structure, when a contact is formed on a wire (such as a gate bus), a trench for forming the wire needs a larger opening to ensure the contact and the wire can be connected in an effective manner.

During the etching process of the trench, a larger opening results in a deeper trench. However, the distance between the electrode in a deep trench and the substrate is smaller, such that breakdown voltage is reduced, and leakage current is readily generated.

SUMMARY OF THE INVENTION

The invention provides a semiconductor structure and a manufacturing method thereof and a terminal area structure of a semiconductor device that can prevent the generation of leakage current while maintaining a high breakdown voltage.

The invention provides a semiconductor structure including a substrate, a first dielectric layer, a first conductive layer, a positioning part, two spacers, and a second conductive layer. The substrate has a first trench. The first dielectric layer is disposed on a surface of the first trench. The first conductive layer is filled in the first trench and located on the first dielectric layer. The positioning part is disposed on the substrate and has a first opening. The first opening exposes the first trench. The spacers are disposed on two sidewalls of the first opening and expose the first conductive layer. The second conductive layer is filled in the first opening and electrically connected to the first conductive layer.

According to an embodiment of the invention, in the semiconductor structure, the first opening can completely expose the first trench.

According to an embodiment of the invention, in the semiconductor structure, the width of the first opening can be greater than or equal to the width of the first trench.

According to an embodiment of the invention, in the semiconductor structure, the spacers can at least cover a part of the first dielectric layer.

According to an embodiment of the invention, in the semiconductor structure, the spacing between the spacers, for instance, decreases from top to bottom.

According to an embodiment of the invention, in the semiconductor structure, a second dielectric layer can be further included. The second dielectric layer is disposed on the positioning part and has a second opening. The second opening exposes the first opening.

According to an embodiment of the invention, in the semiconductor structure, the second conductive layer can be further extended and disposed in the second opening.

According to an embodiment of the invention, in the semiconductor structure, a third conductive layer can be further included. The third conductive layer is disposed on the second dielectric layer and on the second conductive layer.

The invention provides a manufacturing method of a semiconductor structure including the following steps. A substrate is provided, wherein the substrate has a first trench. A first dielectric layer is formed on a surface of the first trench. A first conductive layer is formed on the first dielectric layer in the first trench. A positioning part is formed on the substrate. The positioning part has a first opening, and the first opening exposes the first trench. Two spacers are formed on two sidewalls of the first opening. The first conductive layer is exposed between the spacers. A second conductive layer filled in the first opening is formed. The second conductive layer is electrically connected to the first conductive layer.

According to an embodiment of the invention, in the manufacturing method of the semiconductor structure, the forming method of the positioning part can include the following steps. A positioning material layer is formed on the substrate. A patterning process is performed on the positioning material layer.

According to an embodiment of the invention, in the manufacturing method of the semiconductor structure, the first opening can completely expose the first trench.

According to an embodiment of the invention, in the manufacturing method of the semiconductor structure, the width of the first opening can be greater than or equal to the width of the first trench.

According to an embodiment of the invention, in the manufacturing method of the semiconductor structure, the forming method of the spacers can include the following steps. A spacer material layer is formed on the first opening. An etch-back process is performed on the spacer material layer.

According to an embodiment of the invention, in the manufacturing method of the semiconductor structure, the spacers can at least cover a part of the first dielectric layer.

According to an embodiment of the invention, in the manufacturing method of the semiconductor structure, the spacing between the spacers, for instance, decreases from top to bottom.

According to an embodiment of the invention, in the manufacturing method of the semiconductor structure, the following steps can be further included. A second dielectric layer is formed on the positioning part. A patterning process is performed on the second dielectric layer to form a second opening in the second dielectric layer. The second opening exposes the first opening.

According to an embodiment of the invention, in the manufacturing method of the semiconductor structure, a third conductive layer can further be formed on the second dielectric layer and on the second conductive layer.

The invention provides a terminal area structure of a semiconductor device, including a substrate, a first dielectric layer, a first conductive layer, a positioning part, two spacers, and a second conductive layer. The substrate has a first trench and second trenches. The first trench is intersected with the second trenches. The first dielectric layer is disposed on a surface of the first trench and on a surface of the second trenches. The first conductive layer is filled in the first trench and the second trenches and located on the first dielectric layer. The positioning part is disposed on the substrate and has a first opening. The first opening exposes the first trench. The spacers are disposed on two sidewalls of the first opening and expose the first conductive layer. The second conductive layer is filled in the first opening and electrically connected to the first conductive layer.

According to an embodiment of the invention, in the terminal area structure of the semiconductor device, the second trenches can be parallel to one another.

According to an embodiment of the invention, in the terminal area structure of the semiconductor device, the spacers can at least cover a part of the first dielectric layer.

According to an embodiment of the invention, in the terminal area structure of the semiconductor device, the first trench and the second trenches can be formed in the same process.

Based on the above, in the semiconductor structure and the manufacturing method thereof and the terminal area structure of a semiconductor device provided by the invention, the second conductive layer filled in the first opening can be positioned via the positioning part, and the second conductive layer can be isolated from the substrate via the spacers on the sidewalls of the first opening located at the positioning part, such that the second conductive layer and the first conductive layer can be connected in an effective manner, and the generation of leakage current can be effectively prevented. Via such a structure, the second conductive layer and the first conductive layer can be effectively connected, and therefore a first trench having a larger aperture does not need to be formed, and as a result a shallower first trench having a smaller aperture can be formed to prevent a reduction in breakdown voltage. Moreover, the process complexity of the semiconductor structure and the manufacturing method thereof and the terminal area structure of a semiconductor device provided by the invention is low.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
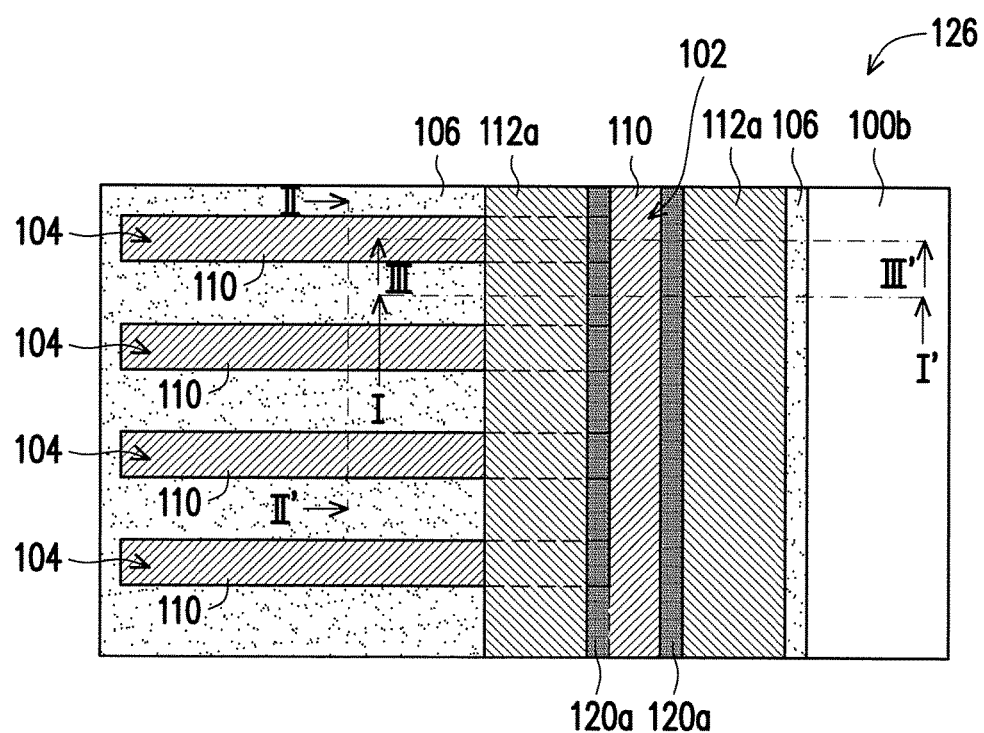
FIG. 1 is a top view of a semiconductor structure of an embodiment of the invention.

FIG. 1 is a top view of a semiconductor structure of an embodiment of the invention. For clarity of illustration, FIG. 1 omits some of the components in FIG. 2I and FIG. 3I. FIG. 2A to FIG. 2I are cross sections of the manufacturing process of the semiconductor structure in FIG. 1 along section line I-I'. FIG. 3A to FIG. 3I are cross sections of the manufacturing process of the semiconductor structure in FIG. 1 along section line II-II'. FIG. 4 is a cross section of the semiconductor structure in FIG. 1 along section line III-III'.

Figure 2A:
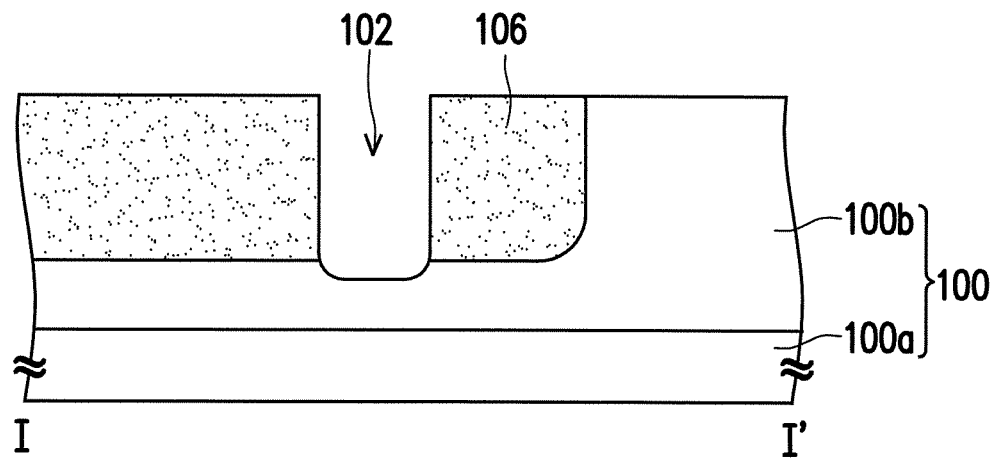
FIG. 2A to FIG. 2I are cross sections of the manufacturing process of the semiconductor structure in FIG. 1 along section line I-I'.
Figure 3A:
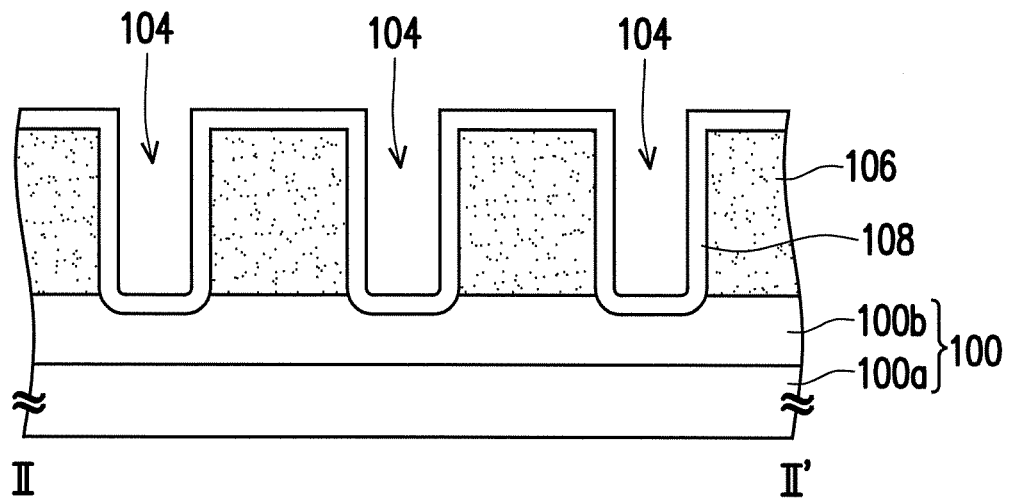
FIG. 3A to FIG. 3I are cross sections of the manufacturing process of the semiconductor structure in FIG. 1 along section line II-II'.
Figure 4:
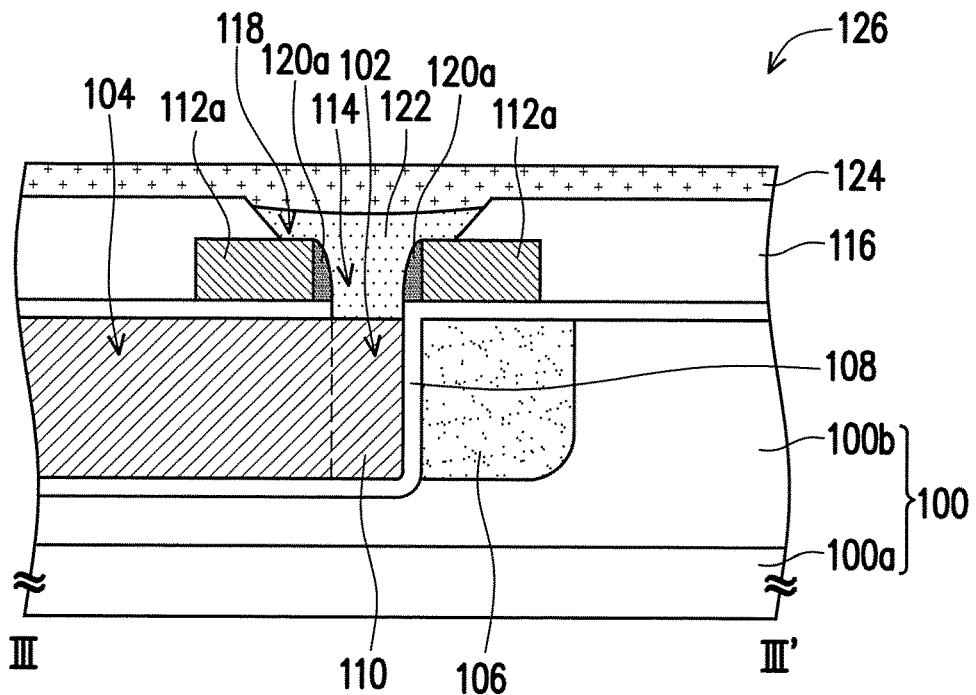
FIG. 4 is a cross section of the semiconductor structure in FIG. 1 along section line III-III'.

Referring to all of FIG. 1, FIG. 2A, and FIG. 3A, a substrate 100 is provided, and the substrate 100 has a first trench 102. Moreover, the substrate 100 can further have second trenches 104, and the first trench 102 is intersected with the second trenches 104. The second trenches 104 can be parallel to one another. The first trench 102 and the second trenches 104 can be formed at the same time by performing a patterning process on the substrate 100, but the invention is not limited thereto. The patterning process is, for instance, a combination of a lithography process and an etching process.

The substrate 100 can be a single-layer structure or a multi-layer structure. In the present embodiment, the substrate 100 is exemplified by a multi-layer structure. For instance, the substrate 100 can include a first conductivity type substrate layer 100a and a first conductivity type epitaxial layer 100b. The first conductivity type epitaxial layer 100b is disposed on the first conductivity type substrate layer 100a. Moreover, the substrate 100 can have a second conductivity type well region 106. Those having ordinary skill in the art can adjust the forming order of the first trench 102, the second trenches 104, and the second conductivity type well region 106 based on process needs.

The first conductivity type can be one of N type and P type, and the second conductivity type can be the other of N type and P type. In the present embodiment, the first conductivity type is exemplified as N type, and the second conductivity type is exemplified as P type.

Figure 2B:
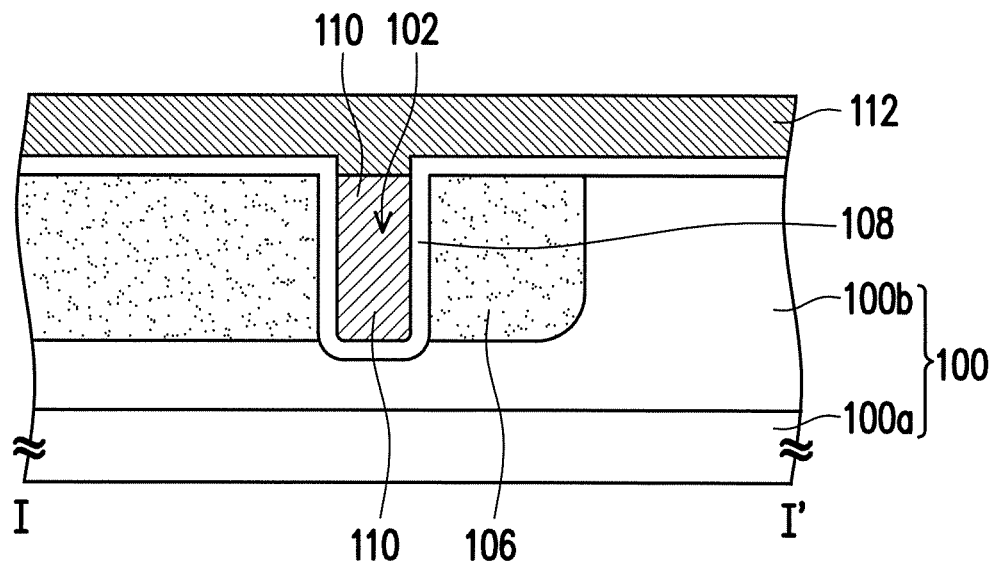
Figure 3B:
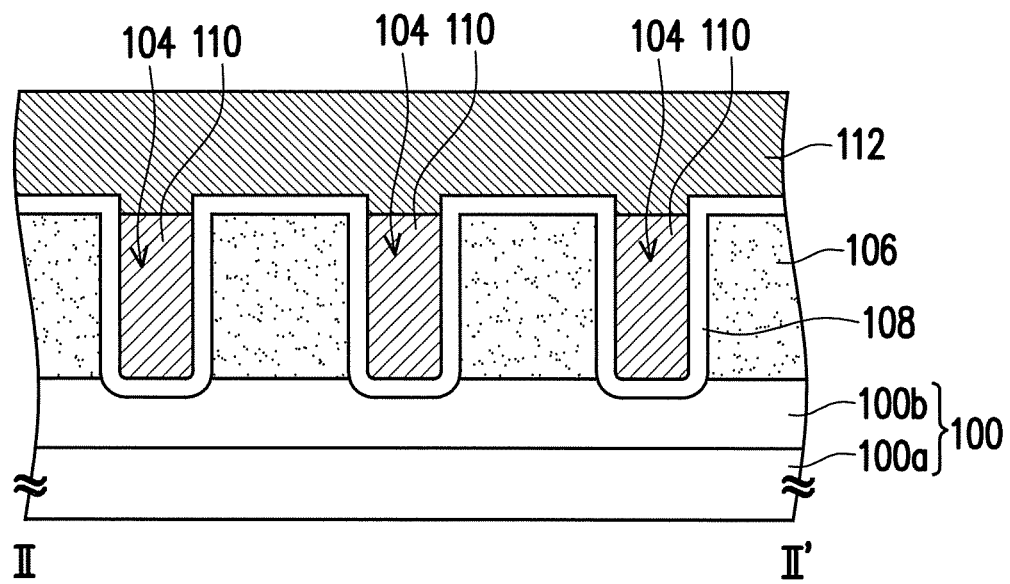

Referring to all of FIG. 1, FIG. 2B, and FIG. 3B, a first dielectric layer 108 is formed on a surface of the first trench 102, and the first dielectric layer 108 can further be formed on a surface of the second trenches 104 and on the top surface of the substrate 100 at the same time. The material of the first dielectric layer 108 is, for instance, oxide. The forming method of the first dielectric layer 108 is, for instance, a thermal oxidation method or a chemical vapor deposition method.

A first conductive layer 110 filled in the first trench 102 is formed on the first dielectric layer 108, and the first conductive layer 110 can further be filled in the second trenches 104 at the same time. The first conductive layer 110 located in the first trench 102 and the first conductive layer 110 located in the second trenches 104 are connected to each other. In the present embodiment, the first conductive layer 110 located in the first trench 102 can be used as a gate bus, and the first conductive layer 110 located in the second trenches 104 can be used as a gate. The material of the first conductive layer 110 is, for instance, doped polysilicon. The forming method of the first conductive layer 110 is, for instance, first forming a first conductive material layer (not shown) completely filling the first trench 102 and the second trenches 104 on the first dielectric layer 108 and then performing an etch-back process on the first conductive material layer. The forming method of the first conductive material layer is, for instance, a chemical vapor deposition method.

A positioning material layer 112 is formed on the first dielectric layer 108 located on the top surface of the substrate 100, and the positioning material layer 112 can further cover the first conductive layer 110. The material of the positioning material layer 112 is, for instance, polysilicon, nitride, or oxide.

Figure 2C:
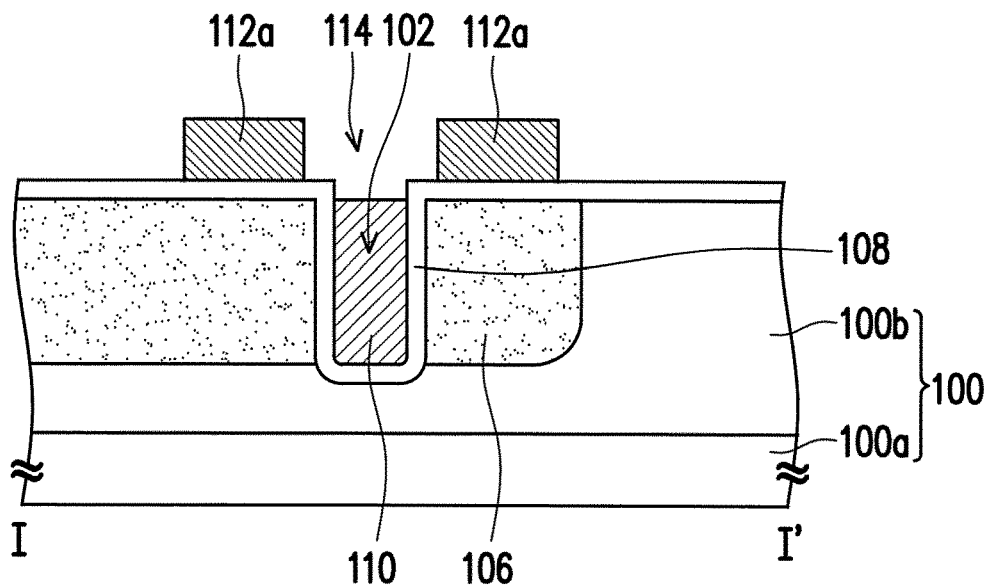
Figure 3C:
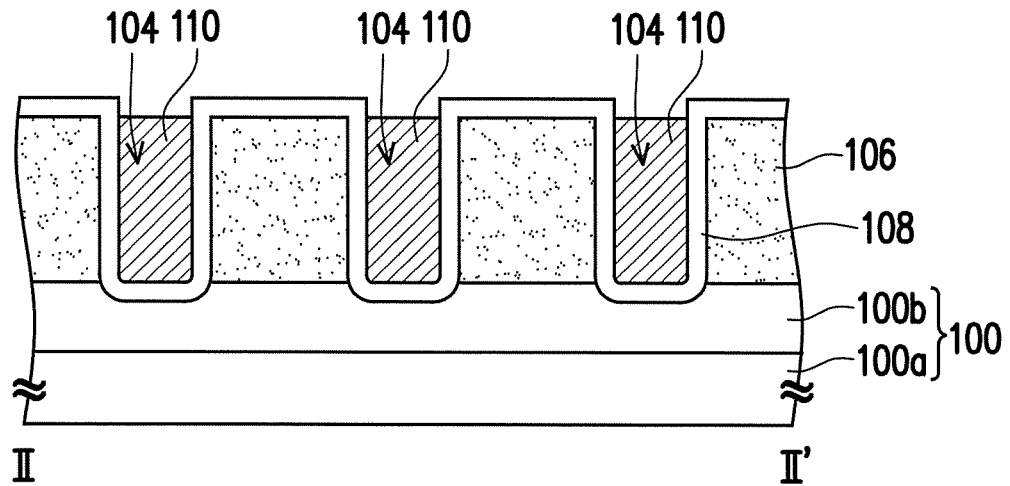

Referring to all of FIG. 1, FIG. 2C, and FIG. 3C, a patterning process is performed on the positioning material layer 112, and a positioning part 112a is formed on the first dielectric layer 108 located on the top surface of the substrate 100. The patterning process is, for instance, a combination of a lithography process and an etching process.

The positioning part 112a has a first opening 114, and the first opening 114 exposes the first trench 102. In the present embodiment, the first opening 114 can completely expose the first trench 102. The width of the first opening 114 can be greater than or equal to the width of the first trench 102. In the present embodiment, the width of the first opening 114 is greater than the width of the first trench 102 as an example.

Figure 2D:
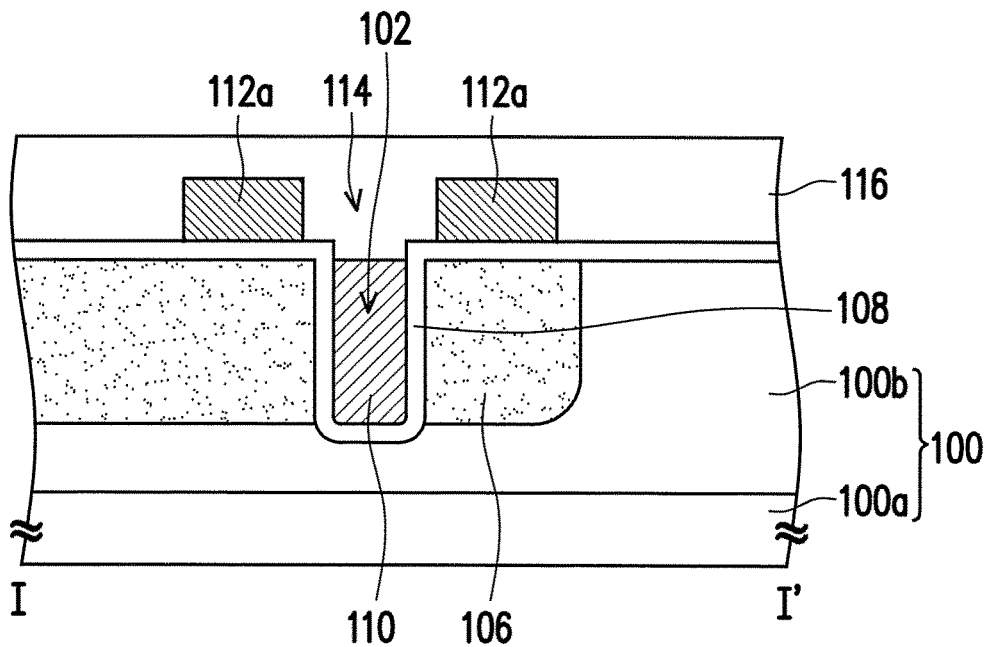
Figure 3D:
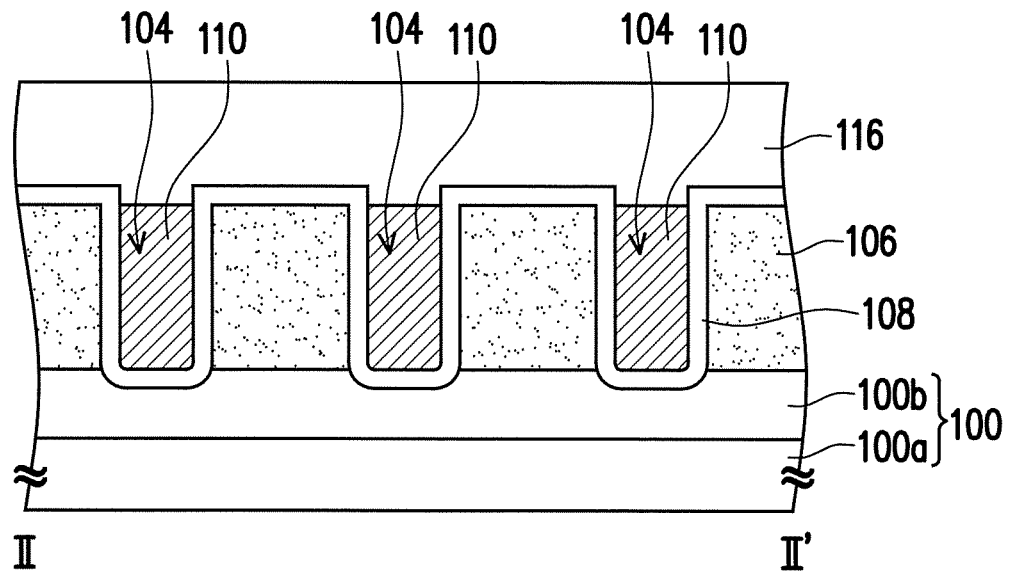

Referring to all of FIG. 1, FIG. 2D, and FIG. 3D, a second dielectric layer 116 is formed on the positioning part 112a. The material of the second dielectric layer 116 is, for instance, oxide. The forming method of the second dielectric layer 116 is, for instance, a chemical vapor deposition method.

Figure 2E:
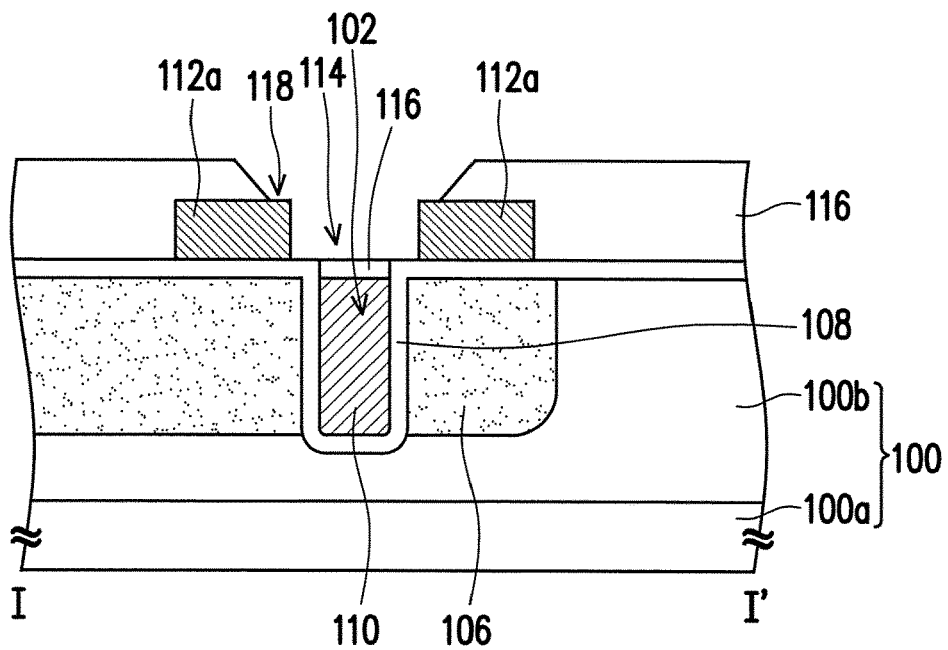
Figure 3E:
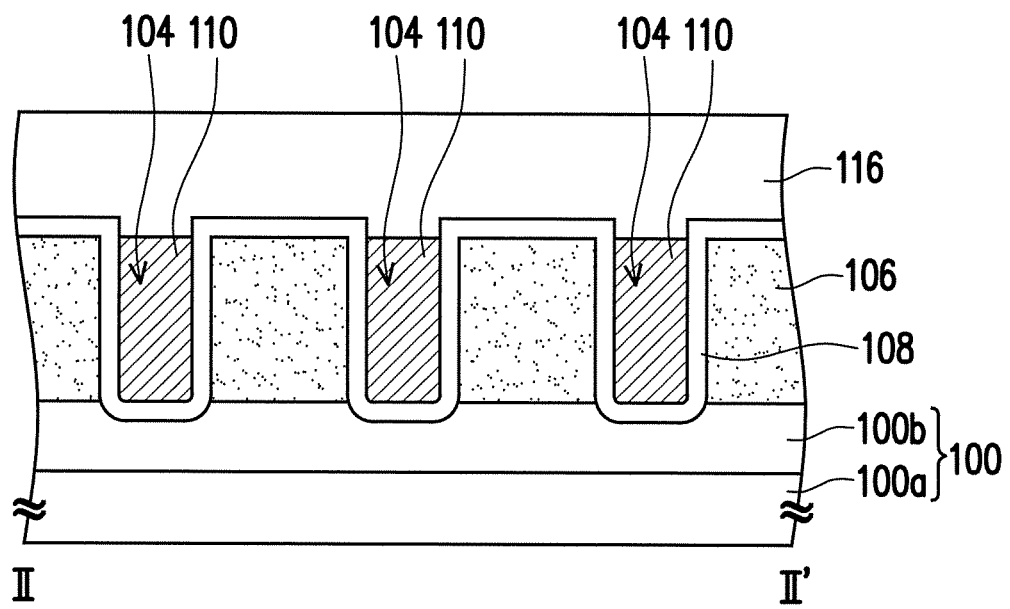

Referring to all of FIG. 1, FIG. 2E, and FIG. 3E, a patterning process is performed on the second dielectric layer 116 to form a second opening 118 in the second dielectric layer 116. The second opening 118 can expose the first opening 114. In the patterning process, to prevent damage to the first dielectric layer 108 located on the sidewall of the first trench 102, a part of the second dielectric layer 116 remains on the first conductive layer 110. The patterning process is, for instance, a combination of a lithography process and an etching process.

Figure 2F:
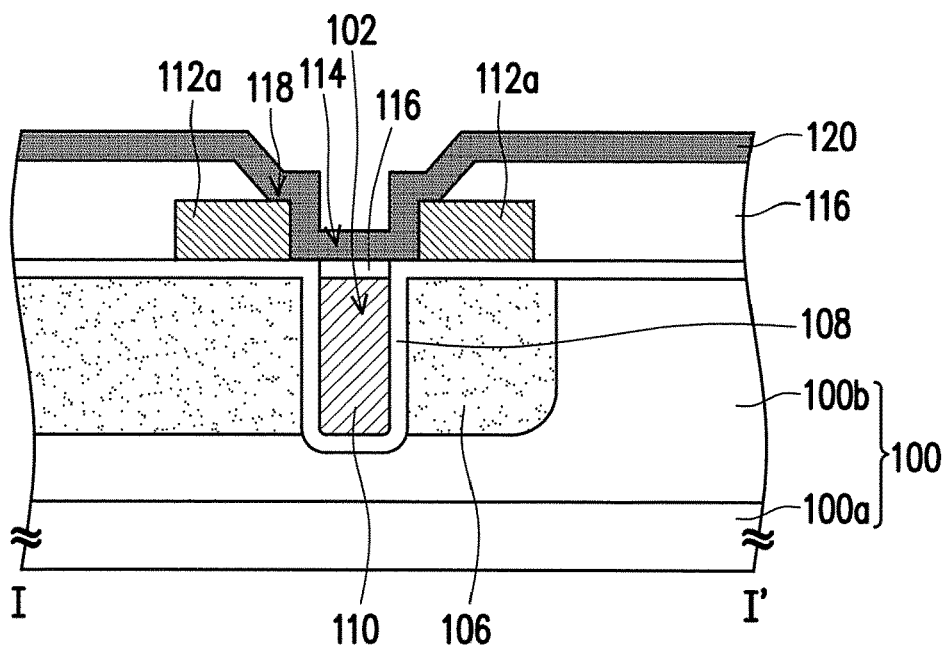
Figure 3F:
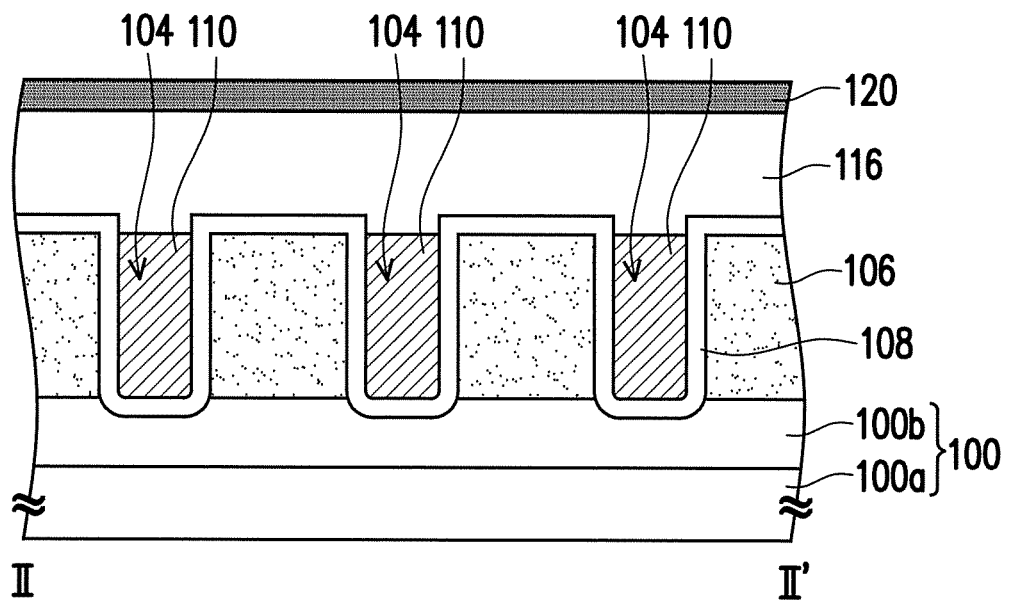

Referring to all of FIG. 1, FIG. 2F, and FIG. 3F, a spacer material layer 120 is formed on the first opening 114. The material of the spacer material layer 120 is a dielectric material such as nitride or oxide. The forming method of the spacer material layer 120 is, for instance, a chemical vapor deposition method.

Figure 2G:
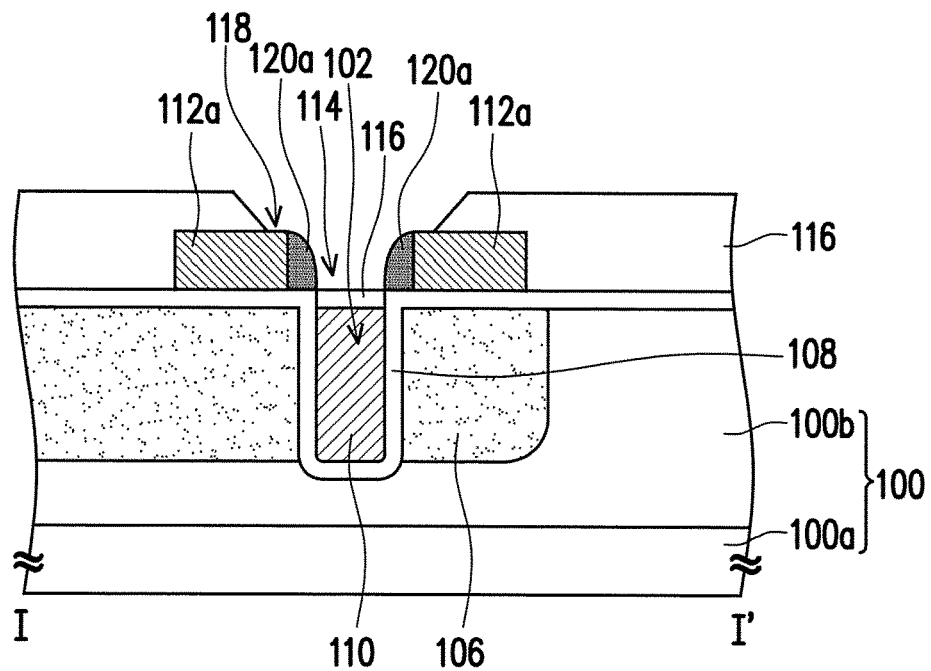
Figure 3G:
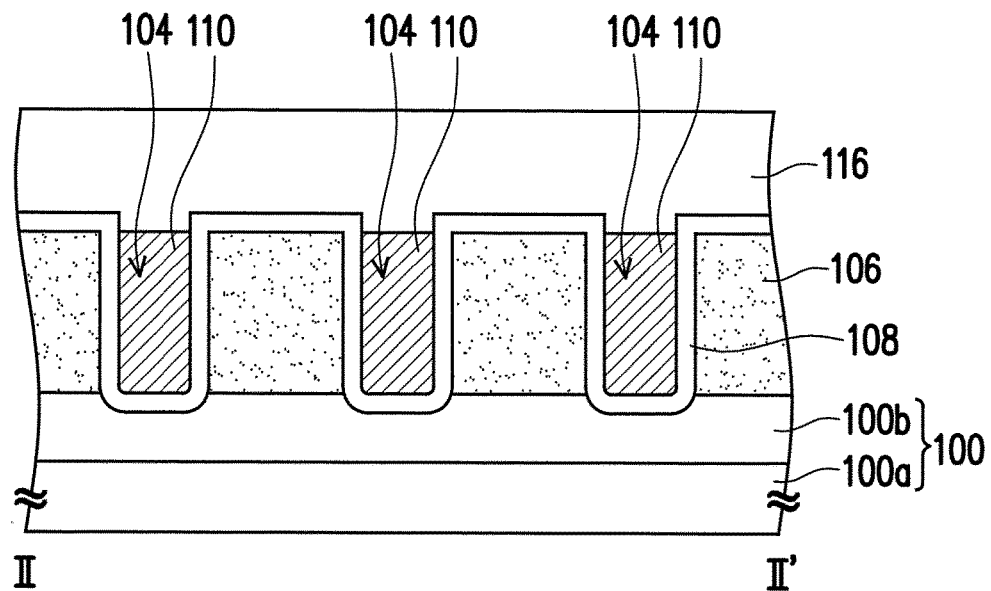

Referring to all of FIG. 1, FIG. 2G, and FIG. 3G, an etch-back process is performed on the spacer material layer 120 to form two spacers 120a on two sidewalls of the first opening 114. The spacers 120a can at least cover a part of the first dielectric layer 108 to protect the first dielectric layer 108 below the spacers 120a. In the present embodiment, the spacers 120a completely cover the first dielectric layer 108, but the invention is not limited thereto. In other embodiments, the spacers 120a can also cover a part of the second dielectric layer 116 remaining on the first conductive layer 110. The spacing between the spacers 120a, for instance, decreases from top to bottom.

In the present embodiment, the second dielectric layer 116 is formed first, and then the spacers 120a are formed as an example, but the invention is not limited thereto. In another embodiment, the spacers 120a can also be formed first, and then the second dielectric layer 116 is formed.

Figure 2H:
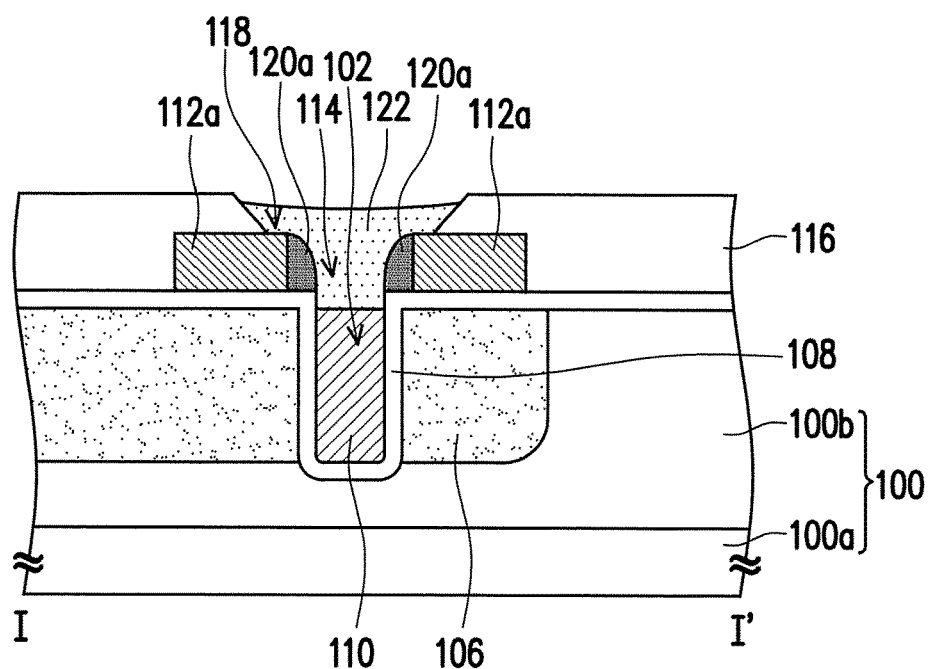
Figure 3H:
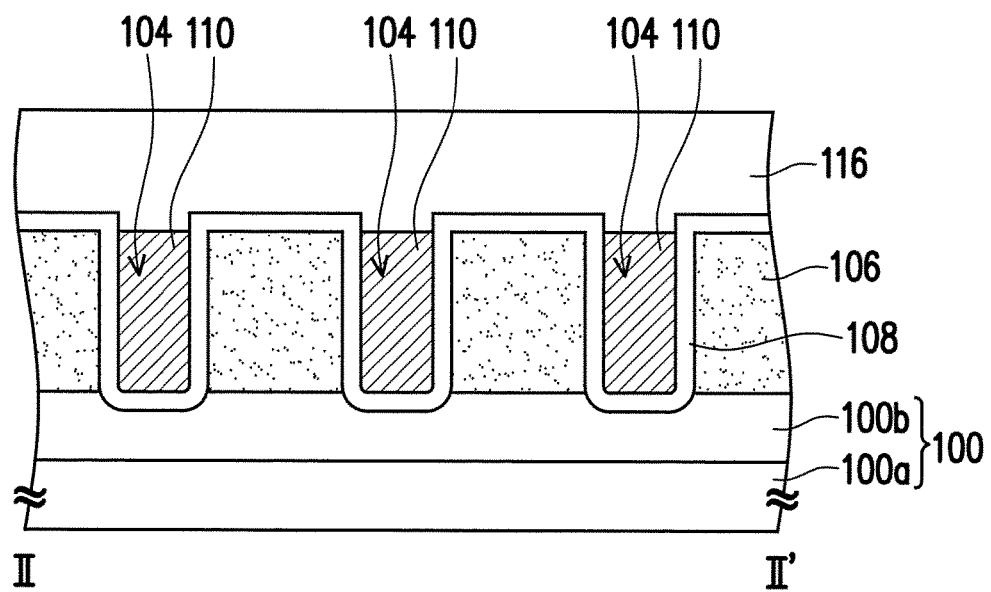

Referring to all of FIG. 1, FIG. 2H, and FIG. 3H, a second dielectric layer 116 remaining on the first conductive layer 110 is removed such that the spacers 120a can expose the first conductive layer 110. The removal method of the second dielectric layer 116 remaining on the first conductive layer 110 is, for instance, a dry etching method. When the second dielectric layer 116 remaining on the first conductive layer 110 is removed, a part of the second dielectric layer 116 at other locations (such as on the positioning part 112a) may also be removed at the same time.

Figure 2I:
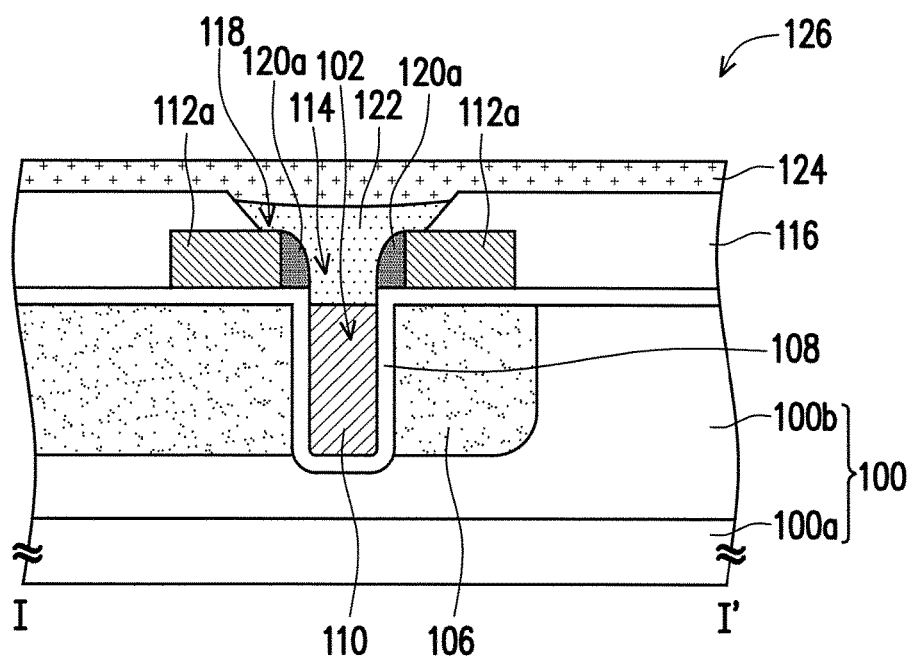
Figure 3I:
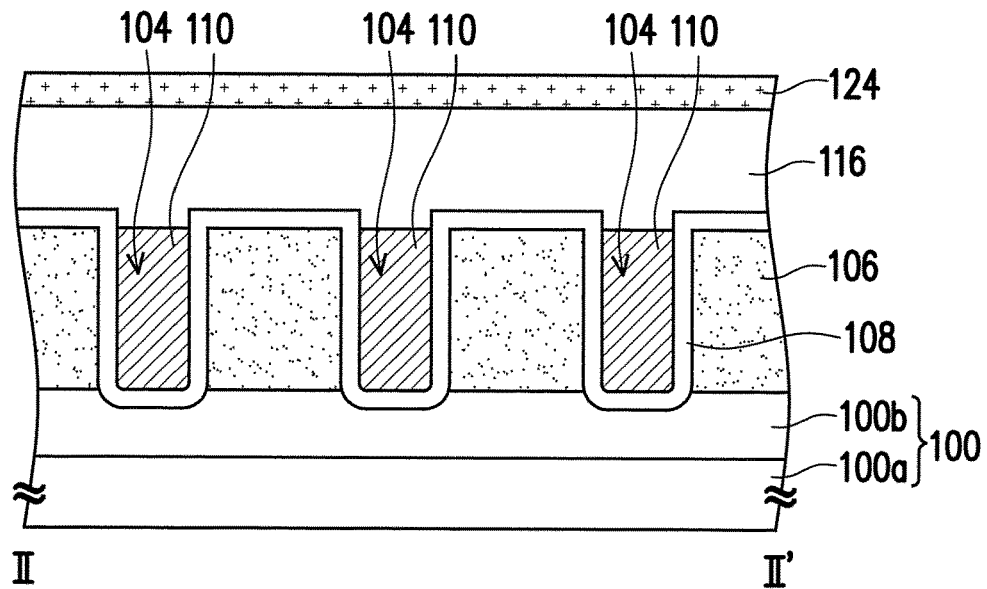

Referring to all of FIG. 1, FIG. 2I, and FIG. 3I, a second conductive layer 122 filled in the first opening 114 is formed. The second conductive layer 122 is electrically connected to the first conductive layer 110. The second conductive layer 122 can be further extended and disposed in the second opening 118. The material of the second conductive layer 122 is, for instance, metal such as tungsten. The forming method of the second conductive layer 122 is, for instance, first forming a second conductive material layer (not shown) completely filling the first opening 114 on the first conductive layer 110 and then performing an etch-back process on the second conductive material layer. The forming method of the second conductive material layer is, for instance, a physical vapor deposition method.

A third conductive layer 124 is formed on the second dielectric layer 116 and on the second conductive layer 122. The material of the third conductive layer 124 is, for instance, metal such as aluminum. The forming method of the third conductive layer 124 is, for instance, a physical vapor deposition method.

In the following, the semiconductor structure 126 of the present embodiment is described via FIG. 1, FIG. 2I, FIG. 3I, and FIG. 4.

Referring to FIG. 1, FIG. 2I, FIG. 3I, and FIG. 4, a semiconductor structure 126 includes a substrate 100, a first dielectric layer 108, a first conductive layer 110, a positioning part 112a, two spacers 120a, and a second conductive layer 122. The substrate 100 has a first trench 102. The first dielectric layer 108 is disposed on a surface of the first trench 102. The first conductive layer 110 is filled in the first trench 102 and located on the first dielectric layer 108. The positioning part 112a is disposed on the substrate 100 and has a first opening 114. The first opening 114 exposes the first trench 102. Moreover, the first dielectric layer 108 can further be extended and disposed between the positioning part 112a and the substrate 100. The spacers 120a are disposed on two sidewalls of the first opening 114 and expose the first conductive layer 110. The second conductive layer 122 is filled in the first opening 114 and electrically connected to the first conductive layer 110. Moreover, the second dielectric layer 116 is disposed on the positioning part 112a and has a second opening 118. The second opening 118 exposes the first opening 114. The second conductive layer 122 can be further extended and disposed in the second opening 118. The third conductive layer 124 is disposed on the second dielectric layer 116 and on the second conductive layer 122.

When the semiconductor structure 126 is used as the terminal area structure of the semiconductor device, the substrate 100 further has second trenches 104, and the first trench 102 is intersected with the second trenches 104. The second trenches 104 can be parallel to one another. The first dielectric layer 108 can be further disposed on a surface of the second trenches 104, and the first conductive layer 110 can be further filled in the second trenches 104. The first conductive layer 110 located in the first trench 102 and the first conductive layer 110 located in the second trenches 104 are connected to each other.

The material, properties, forming method, and disposition of each component of the semiconductor structure 126 are described in detail in the embodiments above and are not repeated herein.

Based on the above, it can be known that in the semiconductor structure 126 and the manufacturing method thereof and the terminal area structure of a semiconductor device of the embodiments, the second conductive layer 122 filled in the first opening 114 can be positioned via the positioning part 112a, and the second conductive layer 122 can be isolated from the substrate 100 via the spacers 120a on the sidewalls of the first opening 114 located at the positioning part 112a, such that the second conductive layer 122 and the first conductive layer 110 can be connected in an effective manner, and the generation of leakage current can be effectively prevented.

Since the second conductive layer 122 and the first conductive layer 110 can be effectively connected, a first trench 102 having a larger aperture does not need to be formed, and therefore a shallower first trench 102 having a smaller aperture can be formed to prevent a reduction in breakdown voltage. Moreover, the process complexity of the semiconductor structure 126 and the manufacturing method thereof and the terminal area structure of the semiconductor device of the embodiments is low.

To sum up, the semiconductor structure and the manufacturing method thereof and the terminal area structure of the semiconductor device of the embodiments can prevent the generation of leakage current while maintaining a high breakdown voltage.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A semiconductor structure, comprising:
   a substrate having a first trench;
   a first dielectric layer disposed on a surface of the first trench;
   a first conductive layer filled in the first trench and located on the first dielectric layer;
   a positioning part disposed on the substrate and having a first opening, wherein the first opening exposes the first trench;
   two spacers disposed on two sidewalls of the first opening and exposing the first conductive layer;
   a second dielectric layer disposed on the positioning part and having a second opening, wherein the second opening exposes the first opening; and
   a second conductive layer filled in the first opening and electrically connected to the first conductive layer, wherein the second conductive layer is further extended and disposed in the second opening.

2. The semiconductor structure of claim 1, wherein a width of the first opening is greater than or equal to a width of the first trench.

3. The semiconductor structure of claim 1, wherein the two spacers at least cover a part of the first dielectric layer.

4. The semiconductor structure of claim 1, wherein a spacing between the two spacers decreases from top to bottom.

5. The semiconductor structure of claim 1, further comprising a third conductive layer disposed on the second dielectric layer and on the second conductive layer.

6. A manufacturing method of a semiconductor structure, comprising:
   providing a substrate, wherein the substrate has a first trench;
   forming a first dielectric layer on a surface of the first trench;
   forming a first conductive layer on the first dielectric layer in the first trench;
   forming a positioning part on the substrate, wherein the positioning part has a first opening, and the first opening exposes the first trench;
   forming two spacers on two sidewalls of the first opening, wherein the first conductive layer is exposed between the two spacers;
   forming a second dielectric layer on the positioning part;
   performing a patterning process on the second dielectric layer to form a second opening in the second dielectric layer, wherein the second opening exposes the first opening; and
   forming a second conductive layer filled in the first opening, wherein the second conductive layer is electrically connected to the first conductive layer, and the second conductive layer is further extended and disposed in the second opening.

7. The manufacturing method of the semiconductor structure of claim 6, wherein a forming method of the positioning part comprises:
   forming a positioning material layer on the substrate; and
   performing a patterning process on the positioning material layer.

8. The manufacturing method of the semiconductor structure of claim 6, wherein a width of the first opening is greater than or equal to a width of the first trench.

9. The manufacturing method of the semiconductor structure of claim 6, wherein a forming method of the two spacers comprises:
   forming a spacer material layer on the first opening; and
   performing an etch-back process on the spacer material layer.

10. The manufacturing method of the semiconductor structure of claim 6, wherein the two spacers at least cover a part of the first dielectric layer.

11. The manufacturing method of the semiconductor structure of claim 6, wherein a spacing between the two spacers decreases from top to bottom.

12. The manufacturing method of the semiconductor structure of claim 6, further comprising forming a third conductive layer on the second dielectric layer and on the second conductive layer.

13. A terminal area structure of a semiconductor device, comprising:
   a substrate having a first trench and second trenches, wherein the first trench is intersected with the second trenches;
   a first dielectric layer disposed on a surface of the first trench and on a surface of the second trenches;
   a first conductive layer filled in the first trench and the second trenches and located on the first dielectric layer;
   a positioning part disposed on the substrate and having a first opening, wherein the first opening exposes the first trench;
   two spacers disposed on two sidewalls of the first opening and exposing the first conductive layer;
   a second dielectric layer disposed on the positioning part and having a second opening, wherein the second opening exposes the first opening; and a second conductive layer filled in the first opening and electrically connected to the first conductive layer, wherein the second conductive layer is further extended and disposed in the second opening.

14. The terminal area structure of the semiconductor device of claim 13, wherein the second trenches are parallel to one another.

15. The terminal area structure of the semiconductor device of claim 13, wherein the two spacers at least cover a part of the first dielectric layer.

16. The terminal area structure of the semiconductor device of claim 13, wherein the first trench and the second trenches are formed in a same process.

* * * * *